US009735036B2

(12) United States Patent
Liu et al.

(10) Patent No.: US 9,735,036 B2
(45) Date of Patent: Aug. 15, 2017

(54) SYSTEM AND METHOD FOR ALIGNING A WAFER FOR FABRICATION

(75) Inventors: Gang Liu, Natick, MA (US); David Michael, Wayland, MA (US)

(73) Assignee: Cognex Corporation, Natick, MA (US)

( * ) Notice: Subject to any disclaimer, the term of this patent is extended or adjusted under 35 U.S.C. 154(b) by 383 days.

(21) Appl. No.: 13/213,999

(22) Filed: Aug. 19, 2011

(65) Prior Publication Data

US 2013/0044206 A1 Feb. 21, 2013

(51) Int. Cl.
| H01L 21/68 | (2006.01) |
| H01L 31/02 | (2006.01) |
| G03F 9/00 | (2006.01) |

(52) U.S. Cl.
CPC .......... H01L 21/681 (2013.01); G03F 9/7092 (2013.01); H01L 31/02 (2013.01)

(58) Field of Classification Search
CPC ...... H01L 2924/00014; H01L 2224/94; G02B 6/12; G02B 6/1225; G02B 6/4214; G02B 6/4231; H04N 5/2257; H04N 5/33
See application file for complete search history.

(56) References Cited

U.S. PATENT DOCUMENTS

| 5,754,679 A | 5/1998 | Koljonen et al. |
| 5,757,956 A | 5/1998 | Koljonen et al. |
| 5,768,443 A | 6/1998 | Michael et al. |
| 8,075,080 B2 * | 12/2011 | Albertalli ............... B41J 2/2135 |
| | | 347/19 |
| 8,428,337 B2 * | 4/2013 | Chan ............................ 382/145 |
| 8,767,220 B2 * | 7/2014 | Hunter ................... H04N 1/387 |
| | | 358/1.12 |
| 8,948,471 B2 * | 2/2015 | Fichtinger et al. ........... 382/128 |
| 2001/0021569 A1 * | 9/2001 | Noda ............................ 438/455 |
| 2003/0025517 A1 * | 2/2003 | Kiest ................. H01L 21/67288 |
| | | 324/750.18 |
| 2005/0171428 A1 * | 8/2005 | Fichtinger et al. ........... 600/426 |

(Continued)

OTHER PUBLICATIONS

Cognex MVS-8000 Series, CVL Vision Tools Guide, CVL 7.0, 966 pages (2011).

(Continued)

*Primary Examiner* — Dave Czekaj
*Assistant Examiner* — Kehinde O Abimbola
(74) *Attorney, Agent, or Firm* — Proskauer Rose LLP

(57) ABSTRACT

Described are computer-based methods and apparatuses, including computer program products, for aligning a wafer for fabrication. A first image of a first portion of a wafer is received from a first image capturing device. A second image of a second portion of the wafer is received from a second image capturing device, wherein an image capturing device transform defines a first relationship between the first image capturing device and the second image capturing device. A first fiducial pattern in the first image and a second fiducial pattern in the second image are identified, based on the image capturing device transform, a fiducial transform that defines, based on a specification for the wafer, a second relationship between the first fiducial pattern and the second fiducial pattern, and a threshold value configured to identify low contrast fiducial patterns on wafers. An alignment of the wafer is determined based on the identified first and second fiducial patterns.

9 Claims, 4 Drawing Sheets

(56) References Cited

U.S. PATENT DOCUMENTS

| | | | |
|---|---|---|---|
| 2006/0249859 A1 | 11/2006 | Eiles et al. | |
| 2007/0058881 A1* | 3/2007 | Nishimura et al. | 382/275 |
| 2007/0219443 A1* | 9/2007 | Ehnholm | A61B 5/055 600/414 |
| 2008/0075322 A1* | 3/2008 | Dube | G06K 9/00134 382/100 |
| 2008/0075380 A1* | 3/2008 | Dube | G06T 7/74 382/255 |
| 2008/0250625 A1* | 10/2008 | Slettemoen | B23Q 17/22 29/407.04 |
| 2008/0262345 A1* | 10/2008 | Fichtinger et al. | 600/426 |
| 2010/0136718 A1 | 6/2010 | Meisel et al. | |
| 2010/0220186 A1* | 9/2010 | Chan | 348/126 |
| 2010/0295896 A1* | 11/2010 | Albertalli | B41J 2/2135 347/37 |
| 2011/0194131 A1* | 8/2011 | Hunter | H04N 1/387 358/1.12 |
| 2011/0268344 A1* | 11/2011 | Chan | 382/145 |

OTHER PUBLICATIONS

SemiTouch Wafer Auto Vision Batch Printer (STWAV), Brochure, Milara, Inc., http://www.milarasmt.com/ (obtained from Internet on Aug. 5, 2001) 4 pages.

\* cited by examiner

SYSTEM AND METHOD FOR ALIGNING A WAFER FOR FABRICATION

FIELD OF THE INVENTION

The present invention relates generally to computer-based methods and apparatuses, including computer program products, for aligning a wafer for fabrication.

BACKGROUND

During wafer fabrication, proper alignment of the wafer is important because it can help facilitate accurate and proper formation of layers on the wafer (e.g., metallic layers, substrate layers, etc.), resulting in a high product yield. For example, screen printers can be used to print layers (e.g., metal contacts) on solar wafers, which often need to be accurately printed over a selective emitter pattern. To align wafers, fiducial(s) on the wafer can be printed using lithography or other printing techniques, and then detected using machine vision and used to align the wafer in the manufacturing process.

However, the fiducials are sometimes degraded in the manufacturing process, resulting in blurry and/or erroneous fiducials that can be hard to detect using machine vision. As an example, additional layers of non-transparent material can be added over the fiducials before alignment. For example, a selective emitter pattern can be screen printed on the solar wafer (e.g., using a paste of silicon nanoparticles). Machine vision is used to detect portions of the selective emitter pattern for alignment. Further, after drying and before alignment, a layer of standard anti-reflective (A/R) coating is often added to the solar wafer over the selective emitter pattern. By the time the metal contacts are to be printed over the selective emitter pattern, the appearance of the alignment fiducials through the selective emitter pattern layer or in the selective emitter pattern has very poor visual contrast (e.g., due to the A/R coating), causing difficulty in detecting the fiducials and aligning the printing screen precisely to the selective emitter pattern.

Poor visual contrast of the layer deposition often makes identification of fiducials in a wafer (e.g., fiducials in the selective emitter pattern of a solar cell) difficult, in terms of both accuracy and robustness (e.g., for machine vision alignment systems). There are approaches known in the art for machine vision systems to be configured to compensate for these problems, but such compensation does not always work. For example, a machine vision system can be configured to use a low contrast threshold to find a fiducial pattern to compensate for poor contrast of the fiducial pattern. However, using a low contrast threshold can return false positive identifications for fiducial patterns. Identifying the "true" fiducial pattern from among many false positive identifications from each separate camera may be quite difficult. When multiple cameras are taken into consideration there can be a combinatorial number of possible matches (e.g. the correct match from each camera). In general, solving combinatorial problems can be quite time consuming because each possible identification from each camera would need to be considered.

SUMMARY OF THE INVENTION

Separate image capturing devices detect strategically spaced fiducials on a wafer (e.g., each image capturing device captures an image of a fiducial, wherein the fiducials are spaced six inches apart). A low threshold can be used to simultaneously detect candidate fiducials in the images, based on transforms indicative of known geometry of the system (e.g., known spacing of the image capturing devices, known spacing of the fiducials, and/or the like).

In one aspect, a computerized method is featured for aligning a solar wafer for fabrication. The method includes receiving from a first image capturing device, by a computing device, a first image of a first portion of a solar wafer, wherein the solar wafer includes a set of fiducial patterns, wherein a pose of each fiducial pattern is defined by a specification for the wafer. The method includes receiving from a second image capturing device, by the computing device, a second image of a second portion of the solar wafer, wherein an image capturing device transform defines a first relationship between the first image capturing device and the second image capturing device. The method includes identifying, by the computing device, a first fiducial pattern in the first image and a second fiducial pattern in the second image. Identification is based on the image capturing device transform, a fiducial transform that defines, based on the specification, a second relationship between the first fiducial pattern and the second fiducial pattern, and a threshold value configured to identify low contrast fiducial patterns on solar wafers. The method includes determining, by the computing device, an alignment of the solar wafer based on the identified first fiducial pattern and second fiducial pattern.

In another aspect, a computer program product is featured, tangibly embodied in a non-transitory computer readable medium. The computer program product includes instructions being configured to cause a data processing apparatus to receive from a first image capturing device a first image of a first portion of a solar wafer, wherein the solar wafer includes a set of fiducial patterns, wherein a pose of each fiducial pattern is defined by a specification for the wafer. The computer program product includes instructions being configured to cause a data processing apparatus to receive from a second image capturing device a second image of a second portion of the solar wafer, wherein an image capturing device transform defines a first relationship between the first image capturing device and the second image capturing device. The computer program product includes instructions being configured to cause a data processing apparatus to identify a first fiducial pattern in the first image and a second fiducial pattern in the second image. The identification is based on the image capturing device transform, a fiducial transform that defines, based on the specification, a second relationship between the first fiducial pattern and the second fiducial pattern, and a threshold value configured to identify low contrast fiducial patterns on solar wafers. The computer program product includes instructions being configured to cause a data processing apparatus to determine an alignment of the solar wafer based on the identified first fiducial pattern and second fiducial pattern.

In another aspect, an apparatus is featured for aligning a wafer for fabrication. The apparatus is configured to receive from a first image capturing device a first image of a first portion of a solar wafer, wherein the solar wafer includes a set of fiducial patterns, wherein a pose of each fiducial pattern is defined by a specification for the wafer. The apparatus is configured to receive from a second image capturing device a second image of a second portion of the solar wafer, wherein an image capturing device transform defines a first relationship between the first image capturing device and the second image capturing device. The apparatus is configured to identify a first fiducial pattern in the first image and a second fiducial pattern in the second image. Identification is based on the image capturing device transform, a fiducial transform that defines, based on the specification, a second relationship between the first fiducial pattern and the second fiducial pattern, and a threshold value configured to identify low contrast fiducial patterns on solar wafers. The apparatus is configured to determine an alignment of the solar wafer based on the identified first fiducial pattern and second fiducial pattern.

In other examples, any of the aspects above can include one or more of the following features. Each fiducial pattern in the set of fiducial patterns can include a plurality of spatially disjoint components. The set of fiducial patterns can be screen printed during printing of a selective emitter pattern on the solar wafer.

In some examples, a third image of a third portion of the wafer receiving from a third image capturing device, wherein a third fiducial pattern is present in the third portion of the wafer, a second image capturing device transform defines a third relationship between the third image capturing device and the first image capturing device, the second image capturing device, or both, and a second fiducial transform defines a fourth relationship between third fiducial pattern and the first fiducial pattern, the second fiducial pattern, or both. The first fiducial pattern, the second fiducial pattern, and the third fiducial pattern can be identified based on the image capturing device transform, the fiducial transform, the second image capturing device transform, the second fiducial transform, and the threshold value.

In other examples, identifying the first fiducial pattern and the second fiducial pattern includes finding a pose of the set of stored patterns among possible poses of the set of stored patterns by maximizing a normalized correlation between the set of stored patterns and the first image, and finding a pose of the set of stored patterns among possible poses of the set of stored patterns by maximizing a normalized correlation between the set of stored patterns and the second image.

In some examples, the first relationship defines a difference between a position of the first image capturing device and a position of the second image capturing device, and an orientation of the first image capturing device and an orientation of the second image capturing device. The second relationship can define a difference between a position of the first fiducial pattern and a position of the second fiducial pattern, and an orientation of the first fiducial pattern and an orientation of the second fiducial pattern.

The techniques, which include both methods and apparatuses, described herein can provide one or more of the following advantages. Robust and accurate alignment of wafers with low-contrast patterns (e.g., solar wafers with low contrast selective emitter patterns) can be achieved by detecting candidate fiducials on images of the wafers using a low detection threshold. While a low detection threshold may risk a high percentage of false positives, a high identification percentage can be achieved by simultaneous detection of candidate fiducials based on known geometries of the system. Fiducials can be located on remote portions of a wafer and properly detected using different image capturing devices even though there may be a low S/N in the captured images.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other aspects, features, and advantages of the present invention, as well as the invention itself, will be more fully understood from the following description of various embodiments, when read together with the accompanying drawings.

DETAILED DESCRIPTION

In general, computerized systems and methods are provided for aligning a pose of a wafer in a manufacturing process. The distance between the image capturing devices can be calibrated (e.g., stored as image capturing device transforms) and used to determine whether or not candidate fiducials in the captured images are actually fiducials (and, in turn, determine the proper wafer alignment and provide that alignment to the manufacturing process). Because the signal to noise (S/N) ratio for detecting fiducials in images of the wafer is often low (e.g., it is difficult to detect fiducials since the images include a large amount of noise), a low detection threshold can be used to ensure most candidate thresholds are detected. While using a low threshold may result in a large number of false positives (e.g., improper identification of noise as a fiducial), the calibrated distance (or baseline) between the image capturing devices can be used to simultaneously identify candidate fiducials (e.g., by allowing candidate fiducials identified in images to be geometrically related to each other, using stored information indicative of known relationships between the fiducials).

For example, if a candidate fiducial is identified in an image captured by a left image capturing device (using a low detection threshold, so the candidate fiducial may be noise), an image captured by a right image capturing device would need to have a second fiducial with an exact geometric correspondence to the candidate fiducial in the left image. Advantageously, using transforms between the image capturing devices and/or the fiducials, a low detection threshold can be used while still having a high probability of successful identification of fiducials. For example, even if poor candidate fiducials are identified in both the left and right images, using known geometry to confirm the locations of the candidate fiducials may make false identification extremely unlikely if both candidate fiducials are in expected locations.

Although the specification and/or figures describe(s) the computerized systems and methods in some embodiments in terms of solar wafer fabrication, these techniques are not so limited and can work equally well for any type of wafer fabrication, such as semiconductor wafer fabrication, and aligning of LCD panels or displays.

Figure 1:
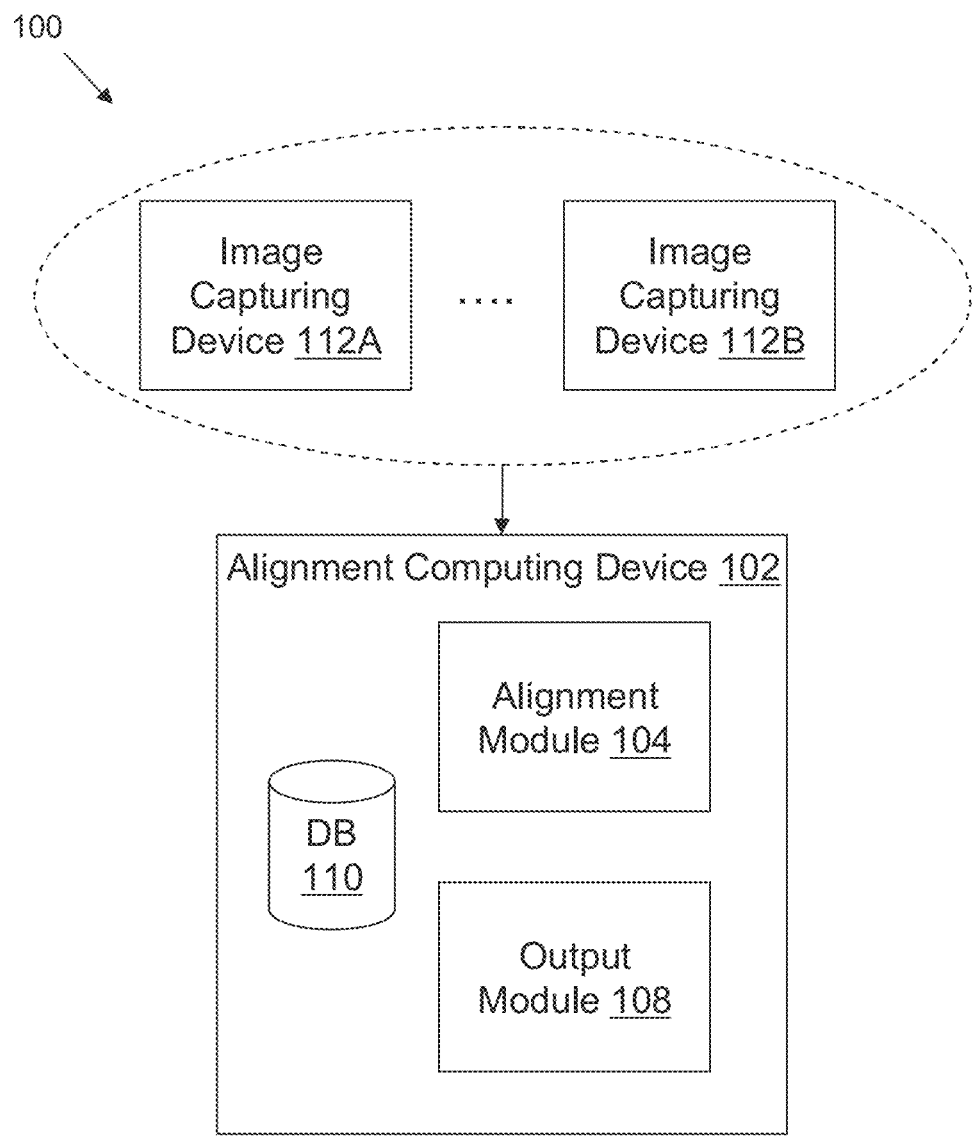
FIG. 1 is an exemplary diagram of a system for aligning a wafer for fabrication.

FIG. 1 is an exemplary diagram of a system 100 for aligning a wafer for fabrication (e.g., by generating data indicative of how to adjust the pose of the wafer). The system 100 includes an alignment computing device 102. The alignment computing device 102 includes an alignment module 104, an output module 108, and a database 110. The system 100 includes image capturing devices 112A through 112B (collectively, image capturing devices 112). While the system 100 is shown with two image capturing devices 112, the system 100 can include any number of image capturing devices (e.g., one, two, through N image capturing devices).

Alignment module 104 receives images from image capturing devices 112 (e.g., images of portions of a wafer that may contain a fiducial). The alignment module 104 is configured to use machine vision techniques to determine whether each of the received images include a candidate fiducial (e.g., whether the image includes a marking or other feature that may be indicative of a fiducial). The fiducial can be any point of reference on the wafer (e.g., whether purposefully placed on the wafer for identification, or whether it is a feature of an existing component or feature of the wafer). A fiducial is also referred to as a fiducial pattern herein, and therefore the words "fiducial" and "fiducial pattern" can be used interchangeably. The fiducial can be, for example, an edge portion or a corner portion of the wafer (or of a layer or other material on the wafer). In some examples, the fiducial is a distinctive fiducial pattern printed on the wafer (e.g., as described below with reference to FIG. 2A). The alignment module 104 can be configured to identify low-contrast candidate fiducials (e.g., fiducials that are hard to identify), which can be subsequently verified by taking into account known transforms between the image capturing devices 112, the fiducials on the wafer, and/or both. The alignment module 104 can be configured to identify fiducials based on unique patterns of the fiducials. Identification of the fiducials is described in further detail with respect to FIG. 3.

The alignment module 104 can store detection data (e.g., in database 110) indicative of whether or not it identified one or more candidate fiducials in an image (e.g., data indicative of an identification, such as a 1; data indicative of no identification, such as a 0; or a score between 0 and 1 indicative of how likely it is that the image includes a fiducial). The alignment module 104 can use the detection data for each image, in conjunction with known transforms (e.g., regarding transforms between image capturing devices 112 and/or fiducials on the wafer) to determine whether or not the candidate fiducials are actual fiducials. This information can be used to determine how to align the subject wafer (e.g., how to manipulate the pose of a wafer in preparation for a manufacturing apparatus).

The transforms define a relationship between two or more items (e.g., between two image capturing devices 112, between two fiducials on a wafer, etc.). The relationship can define poses (e.g., positions and/or orientations), and/or other attributes of the two or more items. For example, if the system 100 includes two image capturing devices 112A, 112B, an image capturing device transform can define a relationship between image capturing devices 112A, 112B. The relationship can be based on the poses of the image capturing devices 112A, 112B. For example, the image capturing device transform can define a difference between a position of image capturing device 112A and a position of image capturing device 112B (e.g., by defining the positions of both image capturing devices 112A, 112B; by defining the position of image capturing device 112A based on the position of image capturing device 112B (e.g., as a transformation, shift, etc.); by defining the position of image capturing device 112B based on the position of image capturing device 112A, etc.). The image capturing device transform can also define a difference between an orientation of image capturing device 112A and an orientation of image capturing device 112B (e.g., by defining the orientations of both image capturing devices 112A, 112B; by defining the orientation of image capturing device 112A based on the orientation of image capturing device 112B (e.g., as a transformation, shift, etc.); by defining the orientation of image capturing device 112B based on the orientation of image capturing device 112A, etc.).

Database 110 can store the transforms, images received from the image capturing devices 112, detection information generated by the alignment module 104 for each image, and/or other data used by the alignment computing device 102. The output module 108 can transmit a signal indicative of how to adjust the pose of a wafer to properly align the wafer for a manufacturing process.

The image capturing devices 112 can be any type of image capturing device, such as a line scan camera, a two dimensional camera, a three dimensional camera, a photodetector, or a microscope camera system. The image capturing devices 112 can be mounted on a manufacturing device such that the image capturing devices 112 are configured to take images of different portions of a wafer to determine the alignment for the manufacturing device. For example, the image capturing devices 112 can be mounted at separate locations on the manufacturing device (e.g., horizontally, vertically, and or rotationally different locations). A set of image capturing device transforms can define the relationships among the image capturing devices 112 such that the images of different portions of the wafer can be correlated.

The system 100 is an example of a computerized system that is specially configured to perform the computerized methods described herein. However, the system structure and content recited with regard to FIG. 1 are for exemplary purposes only and are not intended to limit other examples to the specific structure shown in FIG. 1. As will be apparent to one of ordinary skill in the art, many variant system structures can be architected without departing from the computerized systems and methods described herein.

In addition, information may flow between the elements, components and subsystems described herein using any technique. Such techniques include, for example, passing the information over the network using standard protocols, such as TCP/IP, passing the information between modules in memory and passing the information by writing to a file, database (e.g., using database 110), or some other non-volatile storage device. In addition, pointers or other references to information may be transmitted and received in place of, or in addition to, copies of the information. Conversely, the information may be exchanged in place of, or in addition to, pointers or other references to the information. Other techniques and protocols for communicating information may be used without departing from the scope of the invention.

In some embodiments, the wafers include unique fiducial patterns. For example, when the fiducials are degraded by subsequent manufacturing processes, the quality of the fiducials may be poor. Therefore, it can be difficult for a machine vision system (e.g., system 100) to get a clear view of fiducials. The fiducials can be distinctively designed to help prevent noise in an image of a wafer from improperly being classified as a fiducial. For example, the fiducials can be designed with large spatial support for the fiducial pattern (e.g., the fiducial can include multiple components, each separated by a space in the fiducial pattern).

Figure 2A:
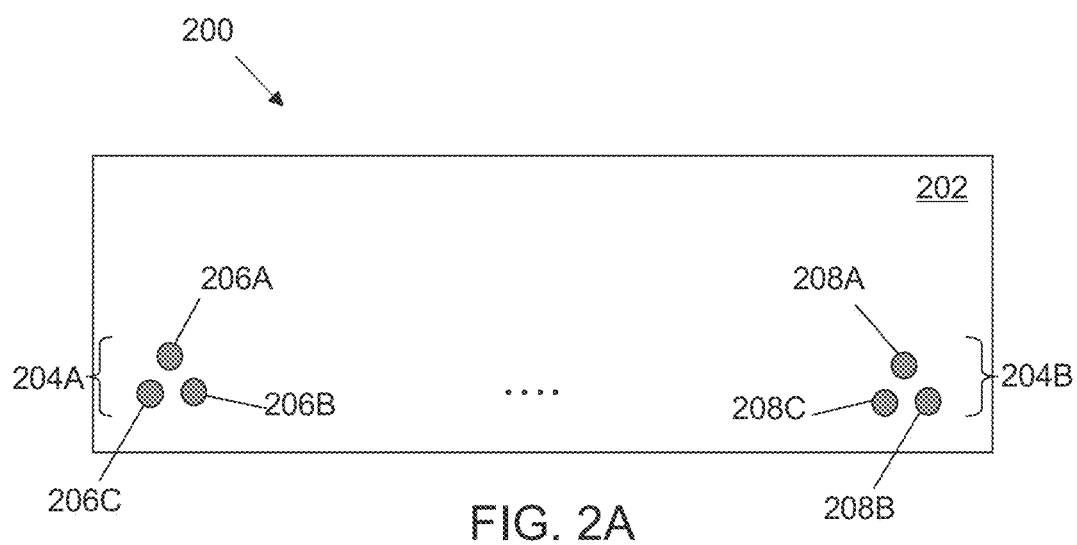
FIG. 2A is an exemplary diagram of a set of fiducials on a wafer.

FIG. 2A is an exemplary diagram 200 of a set of fiducials on a wafer 202. Wafer 202 includes fiducials 204A through 204B (collectively, fiducials 204). Fiducial 204A includes three dots 206A, 206B and 206C (collectively, dots 206), wherein each dot is arranged at the vertices of an imaginary equilateral triangle. Fiducial 204B similarly includes three dots 208A, 208B and 208C (collectively, dots 208), wherein each dot is arranged at the vertices of an imaginary equilateral triangle. The radius of the dots 206, 208 can be configured such that each dot is large enough to be detected using machine vision. The fiducials shown in FIG. 2A are exemplary only, and one of skill in the art can appreciate that other fiducials with various spatial arrangements can be designed without departing from the spirit of the fiducials disclosed herein. Advantageously, distinctively designed patterns can be used for fiducials to allow use of a low threshold for detection of the fiducials without a high risk of false alarm.

While FIG. 2A only shows two fiducials 204, wafer 202 can include any number of fiducials in the set of fiducials (e.g., one, two, to N fiducials). In some embodiments, in order to accurately align the object, multiple fiducials may be required. For example, identifying a single fiducial can still allow the object to rotate around the fiducial. Using two fiducials can advantageously determine the absolute location of the object.

A specification for the wafer 202 can define fiducial transforms (or relationships) for each fiducial 204. For example, the specification can define the position and/or orientation of each fiducial individually, the position and/or orientation for each fiducial based on one or more other fiducials from the set of fiducials 204, and/or the like. The specification can be stored in database 110.

Figure 2B:
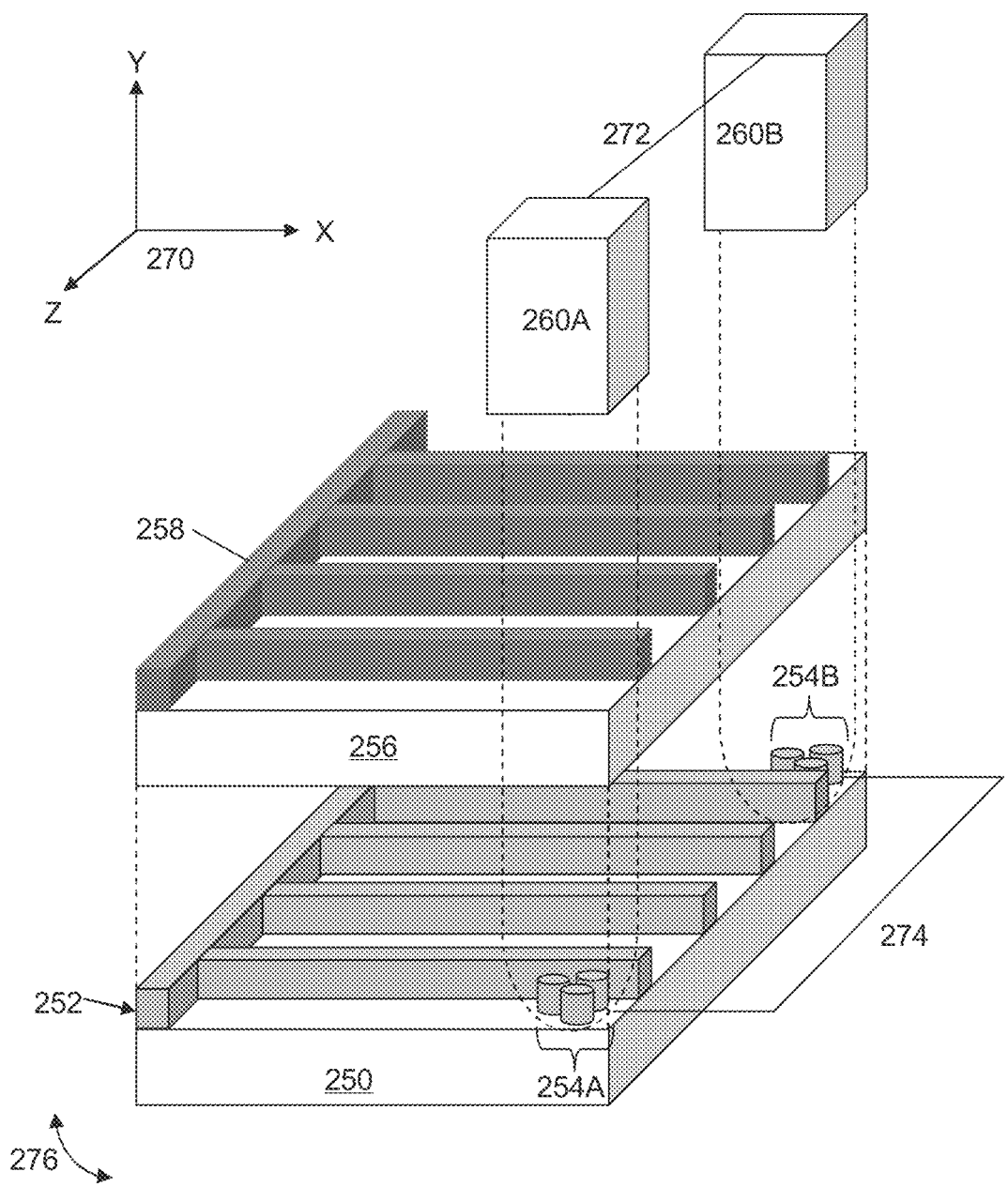
FIG. 2B is an exemplary exploded view of a solar wafer with fiducials printed during creation of a selective emitter pattern.

FIG. 2B is an exemplary exploded view of a solar wafer 250 with fiducials printed during creation of a selective emitter pattern. Wafer 250 includes a selective emitter pattern 252, with fiducials 254A and 254B (collectively, fiducials 254) printed during creation of the selective emitter pattern 252. Advantageously, since fiducials 254 are printed during creation of the selective emitter pattern 252, by aligning to the fiducials 254, a system can align to the selective emitter pattern 252 (e.g., for printing metal contacts 258). Wafer 250 includes A/R layer 256, which is deposited on top of the selective emitter pattern 252. A/R layer 256 is shown away from the selective emitter pattern 252 (as indicated by the dotted lines) to clearly show the fiducials 254A, 254B. Metal contacts 258 are printed on top of the A/R layer 256. Image acquisition device 260A is configured to capture an image of a first portion of the wafer 250 (e.g., which includes fiducial 254A). Image acquisition device 260B is configured to capture an image of a second portion of the wafer 250 (e.g., which includes fiducial 254B).

The components of FIG. 2B are in coordinate system 270. Image capturing device transform 272 describes the relationship between image capturing device 260A and image capturing device 260B in coordinate system 270. Fiducial transform 274 describes the relationship between fiducial 254A and fiducial 254B in coordinate system 270. Wafer pose 276 describes the pose of wafer 250 in coordinate system 270.

Figure 3:
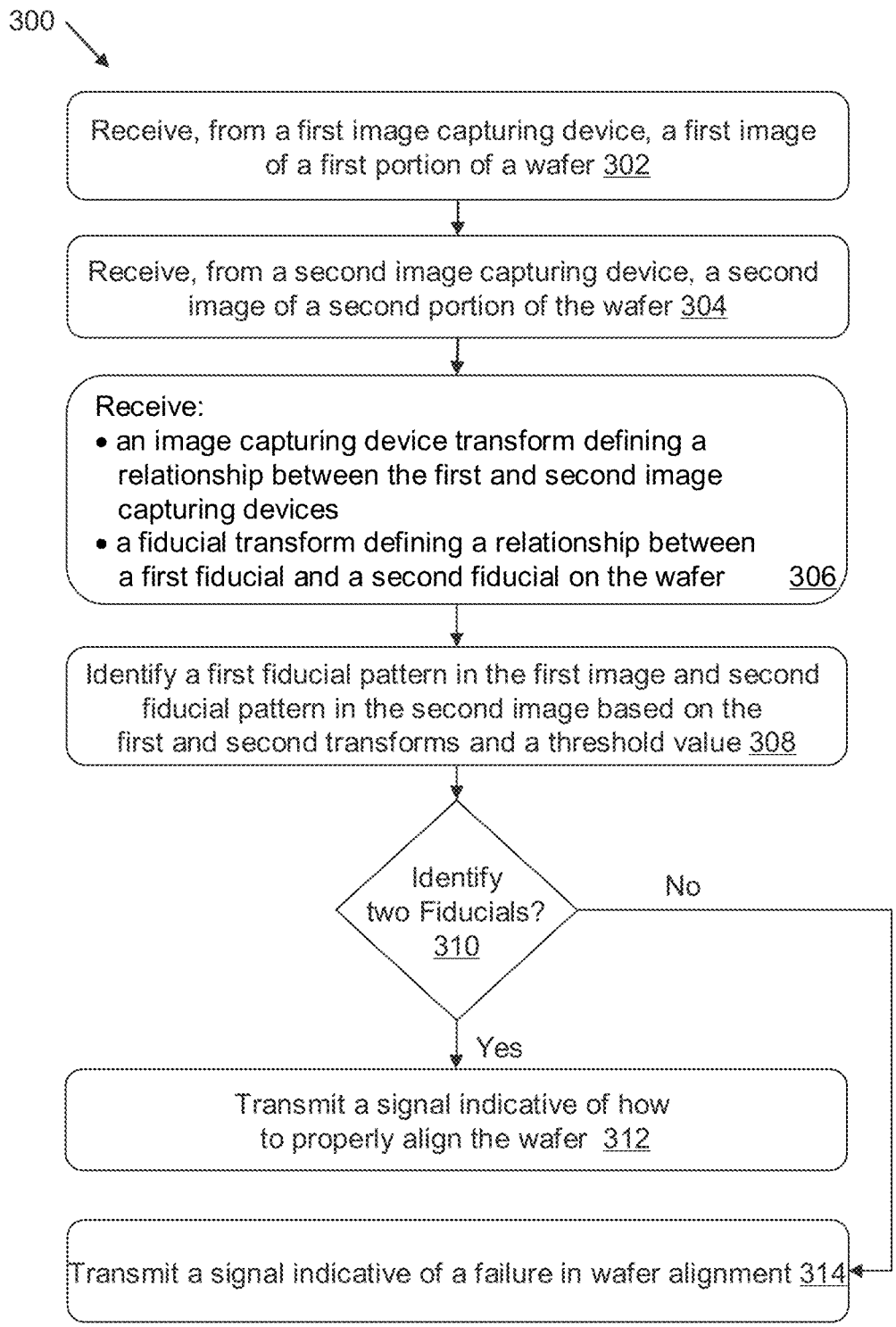
FIG. 3 illustrates an exemplary computerized method for aligning a wafer for fabrication.

The pose of a wafer (e.g., wafer pose 276 of wafer 250) can be adjusted to align the wafer during a manufacturing process by taking images of different portions of a wafer (e.g., by image to determine whether each image includes a fiducial). The fiducials can be identified based on machine vision detection thresholds, image capturing device transforms between the image capturing devices, and/or fiducial transforms between the fiducials on the wafer. FIG. 3 illustrates an exemplary computerized method 300 for aligning the pose of a wafer for fabrication. Referring to FIG. 1, at step 302 the alignment module 104 receives, from image capturing device 112A, a first image of a first portion of a wafer (e.g., wafer 250). At step 304, the alignment module 104 receives, from image capturing device 112B, a second image of a second portion of the wafer.

At step 306, the alignment computing device 102 receives data indicative of an image capturing device transform that defines a relationship between the image capturing devices 112A, 112B (e.g., data indicative of a relative position and/or orientation between the image capturing devices 112A, 112B). For example, a training calibration procedure can be used to generate the data indicative of the image capturing device transform by calibrating the distance and orientation between the image capturing devices 112A, 112B. The alignment computing device 102 receives data indicative of a fiducial transform that defines a relationship between a first fiducial and a second fiducial (e.g., data indicative of a relative position and/or orientation between fiducial 204A and 204B of FIG. 2). For example, a wafer specification (e.g., stored in database 110) can define the fiducial transform (or can be used to extract information to define the fiducial transform).

At step 308, the alignment module 104 attempts to identify a first fiducial pattern (e.g., fiducial 204A) in the first image and a second fiducial pattern (e.g., fiducial 204B) in the second image. The alignment module 104 performs the (attempted) identification of the first and second fiducial patterns based on the image capturing device transform, the fiducial transform, and a threshold value (e.g., a threshold value used by the alignment module 104, configured such that the alignment module 104 can identify low contrast fiducial patterns on wafers). At step 310, the output module 108 determines whether the alignment module 104 identified two fiducials. If the alignment module 104 identified a fiducial in each image, the method 300 proceeds to step 312 and the output module 108 transmits a signal indicative of how to precisely align the wafer (e.g., how to precisely adjust the pose of the wafer to align the print screen to the wafer). If the alignment module 104 did not identify a fiducial in each image, the method 300 proceeds to step 314 and the output module 108 transmits a signal indicative of improper wafer alignment (e.g., and therefore the pose of the wafer or cameras or lighting should be adjusted before trying to determine the alignment again or rejecting the wafer).

Referring to steps 302 and 304, the alignment module 104 can be configured (e.g., using a threshold value) to identify low contrast fiducial patterns on a wafer. The alignment module 104 can be configured to identify fiducial patterns by finding one or several poses that maximize the normalized correlation between the images that should contain a fiducial pattern and a set of stored patterns from among all possible poses of the stored pattern within the image. The alignment module 104 searches for peak values of normalized correlation. Each time the alignment module 104 identifies a peak value of normalized correlation in the space of possible poses of the stored pattern in the image, and that peak value is over the low threshold, it is considered a candidate. Alternative methods such as geometric pattern matching can also be used to find candidate poses for the fiducials in the images.

Since the success of fiducial detection is often related to the fiducial definition itself (e.g., the quality of the fiducial), fiducials with distinctive patterns can be generated while still being easy to create. Advantageously, even in low S/N ratio (e.g., where detection of the fiducials over noise is low and therefore hard to detect), the alignment module 104 can use image correlation-based techniques to handle the low S/N ratio (e.g., by extracting as much signal from the background as possible). For example, the alignment module 104 can use correlation-based techniques to score candidates (e.g., between 0 and 1, where 1 is perfect match, 0 is no match at all, and values between the range of 0 to 1 indicate how close the match is). The threshold for a successful match can be reduced to 0.1 or 0.2, and at which there is a high risk of false alarms. However, advantageously the alignment module 104 can be configured to use a low threshold to detect candidate fiducials, and to verify the candidate fiducials are actual fiducials to result in a minimal risk in improperly classifying candidate fiducials as being actual fiducials (e.g., as improperly classifying noise as a fiducial).

Features for the image recognition can be adjusted. For example, the alignment module 104 can be configured to match a predefined number of features, to pre-process the images before searching for candidate fiducials (e.g., to remove noise), correlation parameters, etc. In some examples, the image can be manipulated when searching for a candidate fiducial (e.g., when searching for a match between a candidate fiducial and fiducial patterns), such as rotating the image, stretching the image, and/or the like.

Referring to steps 306 and 308, the alignment module 104 uses the transforms to simultaneously detect in both images candidate fiducials with the correct relationship. As described above, the transforms define relative relationships (e.g., positions, orientations) between two items (e.g., between image capturing devices, between fiducials, etc.).

Advantageously, fiducials can be located on remote portions of a wafer with a large span between the fiducials, and properly detected even though there is low S/N in the captured images. For example, the alignment module 104 can detect two candidate fiducials, each candidate fiducial being located in a corresponding image captured by one of two image capturing devices that are separated by a long baseline (or distance). The alignment module 104 searches for candidate fiducials that are located a same distance apart as the actual distance between fiducials (e.g., based on the distance of the fiducials and the baseline of the two image capturing devices Additionally, for example, alignment computing devices (e.g., such as alignment device 102) can be employed without requiring additional changes to the fabrication devices. For example, since the alignment computing device 102 uses transforms to verify candidate fiducials, a better illumination system need not be employed by the fabrication devices.

For example, two hi-res microscope camera systems can be used to look at a wafer, where the microscopes are separated by six inches from each other. Under one microscope camera system, the alignment module 104 detects a candidate fiducial (e.g., a faint pattern that may be a fiducial). The alignment module 104 can simultaneously use an image captured by the second microscope camera system based on the distance between the microscopes and the known distance between fiducials. In some examples, the alignment module 104 detects a plurality of candidate fiducials in all of the images. For example, U.S. Pat. No. 5,768,443, which is incorporated by reference herein in its entirety, describes methods for coordinating multiple fields of view in a multi-camera machine vision system.

Referring to steps 310 through 314, the fabrication device may adjust the pose of the wafer until the wafer is properly aligned for fabrication once sufficient fiducials on the wafer are found and the alignment is determined. Referring to 312, the pose of the wafer can be physically aligned using any known alignment technique such as adjusting the pose of the wafer or moving the fabrication equipment while the wafer is stationary. For example, U.S. Pat. Nos. 5,754,679 and 5,757,956, which are incorporated by reference herein in their entirety, disclose techniques for locating bonding pads in an image. As another example, the Cognex MVS-800 Series, CVL Vision Tools Guide, which is incorporated by reference herein in its entirety, describes tools that can be used to estimate the pose of a pattern in an image, which can be used to align the wafer. For example, pages 496 to 644 describe generic tools for estimating the pose of a pattern in an image, CNLSearch, PatMax, and RSI Search. RSI Search, for example, can find the pose of a pattern undergoing translation, rotation, and scale using normalized correlation.

While the computerized method 300 of FIG. 3 addresses using two image capturing devices (and two images to search for fiducials), any number of image capturing devices can be used. For example, a single moving image capturing device can be used to capture images of different portions of the wafer. As another example, the alignment module 104 can receive, from a third image capturing device, a third image of a third portion of the wafer. The third portion of the wafer may include a fiducial pattern (e.g., a different fiducial pattern than that in the images captured by image capturing devices 112A, 112B). The database 110 can store a second image capturing device transform that defines a relationship between the third image capturing device and image capturing device 112A, image capturing device 112B, or both. The database 110 can also store a second fiducial transform that defines a relationship between the third fiducial pattern and the first fiducial pattern, the second fiducial pattern, or both. The alignment module 104 can use the image and the relationships defined by the transforms to identify the first, second and third fiducial patterns.

Further, for example, multiple candidate fiducials can be identified in each image, and then compared with one or more fiducials in a different image to determine which of the multiple candidate fiducials is an actual fiducial.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the invention by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit). Subroutines can refer to portions of the computer program and/or the processor/special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Computer-readable storage devices suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributed computing system that includes a front-end component. The front-end component can, for example, be a client computer having a graphical user interface, a Web browser through which a user can interact with an example implementation, and/or other graphical user interfaces for a transmitting device. The above described techniques can be implemented in a distributed computing system that includes any combination of such back-end, middleware, or front-end components.

The computing system can include clients and servers. A client and a server are generally remote from each other and typically interact through a communication network. The relationship of client and server arises by virtue of computer programs running on the respective computers and having a client-server relationship to each other.

The components of the computing system can be interconnected by any form or medium of digital or analog data communication (e.g., a communication network). Examples of communication networks include circuit-based and packet-based networks. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

Devices of the computing system and/or computing devices can include, for example, a computer, a computer with a browser device, a telephone, an IP phone, a mobile device (e.g., cellular phone, personal digital assistant (PDA) device, laptop computer, electronic mail device), a server, a rack with one or more processing cards, special purpose circuitry, and/or other communication devices. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). A mobile computing device includes, for example, a Blackberry®. IP phones include, for example, a Cisco® Unified IP Phone 7985G available from Cisco System, Inc, and/or a Cisco® Unified Wireless Phone 7920 available from Cisco System, Inc.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A computerized method for aligning a solar wafer for fabrication, comprising:
   receiving from a first image capturing device, by a computing device, a first image of a first portion of a solar wafer, wherein the solar wafer comprises a set of fiducial patterns, wherein a pose of each fiducial pattern is defined by a specification for the wafer;
   receiving from a second image capturing device, by the computing device, a second image of a second portion of the solar wafer, wherein an image capturing device transform defines a first relationship between the first image capturing device and the second image capturing device;
   identifying, by the computing device, a first fiducial pattern in the first image and a second fiducial pattern in the second image, based on:
      the image capturing device transform;
      a fiducial transform that defines, based on the specification, a second relationship between the first fiducial pattern and the second fiducial pattern; and
      a threshold value configured to identify low contrast fiducial patterns on solar wafers; and
   determining, by the computing device, an alignment of the solar wafer based on the identified first fiducial pattern and second fiducial pattern.

2. The method of claim 1, wherein each fiducial pattern in the set of fiducial patterns comprises a plurality of spatially disjoint components.

3. The method of claim 1, wherein the set of fiducial patterns are screen printed during printing of a selective emitter pattern on the solar wafer.

4. The method of claim 1 further comprising:
receiving from a third image capturing device a third image of a third portion of the wafer, wherein:
- a third fiducial pattern is present in the third portion of the wafer;
- a second image capturing device transform defines a third relationship between the third image capturing device and the first image capturing device, the second image capturing device, or both; and
- a second fiducial transform defines a fourth relationship between third fiducial pattern and the first fiducial pattern, the second fiducial pattern, or both; and identifying the first fiducial pattern, the second fiducial pattern, and the third fiducial pattern based on the image capturing device transform, the fiducial transform, the second image capturing device transform, the second fiducial transform, and the threshold value.

5. The method of claim 1, wherein identifying the first fiducial pattern and the second fiducial pattern comprises:
finding a pose of the set of stored patterns among possible poses of the set of stored patterns by maximizing a normalized correlation between the set of stored patterns and the first image; and
finding a pose of the set of stored patterns among possible poses of the set of stored patterns by maximizing a normalized correlation between the set of stored patterns and the second image.

6. The method of claim 1, wherein the first relationship defines a difference between:
a position of the first image capturing device and a position of the second image capturing device; and
an orientation of the first image capturing device and an orientation of the second image capturing device.

7. The method of claim 1, wherein the second relationship defines a difference between:
a position of the first fiducial pattern and a position of the second fiducial pattern; and
an orientation of the first fiducial pattern and an orientation of the second fiducial pattern.

8. A computer program product, tangibly embodied in a non-transitory computer readable medium, the computer program product including instructions being configured to cause a data processing apparatus to:

receive from a first image capturing device a first image of a first portion of a solar wafer, wherein the solar wafer comprises a set of fiducial patterns, wherein a pose of each fiducial pattern is defined by a specification for the wafer;
receive from a second image capturing device a second image of a second portion of the solar wafer, wherein an image capturing device transform defines a first relationship between the first image capturing device and the second image capturing device;
identify a first fiducial pattern in the first image and a second fiducial pattern in the second image, based on:
the image capturing device transform;
a fiducial transform that defines, based on the specification, a second relationship between the first fiducial pattern and the second fiducial pattern; and
a threshold value configured to identify low contrast fiducial patterns on solar wafers; and
determine an alignment of the solar wafer based on the identified first fiducial pattern and second fiducial pattern.

9. An apparatus for aligning a wafer for fabrication, configured to:
receive from a first image capturing device a first image of a first portion of a solar wafer, wherein the solar wafer comprises a set of fiducial patterns, wherein a pose of each fiducial pattern is defined by a specification for the wafer;
receive from a second image capturing device a second image of a second portion of the solar wafer, wherein an image capturing device transform defines a first relationship between the first image capturing device and the second image capturing device;
identify a first fiducial pattern in the first image and a second fiducial pattern in the second image, based on:
the image capturing device transform;
a fiducial transform that defines, based on the specification, a second relationship between the first fiducial pattern and the second fiducial pattern; and
a threshold value configured to identify low contrast fiducial patterns on solar wafers; and
determine an alignment of the solar wafer based on the identified first fiducial pattern and second fiducial pattern.

* * * * *